United States Patent [19]
Miyamoto et al.

[11] Patent Number: 6,146,749
[45] Date of Patent: Nov. 14, 2000

[54] LOW DIELECTRIC COMPOSITION, INSULATING MATERIAL, SEALING MATERIAL, AND CIRCUIT BOARD

[75] Inventors: Masahiro Miyamoto; Nobuyuki Ito; Teruo Hiraharu, all of Tokyo, Japan

[73] Assignee: JSR Corporation, Tokyo, Japan

[21] Appl. No.: 09/303,604

[22] Filed: May 3, 1999

[51] Int. Cl.$^7$ ...................................................... B32B 3/26
[52] U.S. Cl. ...................... 428/320.2; 428/209; 428/323; 428/327; 428/339; 174/259; 106/14.44; 257/783
[58] Field of Search .............................. 428/209, 320.2, 428/323, 327, 339; 174/259; 525/292; 106/14.44; 257/783

[56] References Cited

U.S. PATENT DOCUMENTS

| | | | |
|---|---|---|---|
| 4,331,784 | 5/1982 | Ishibashi et al. | 525/292 |
| 4,965,290 | 10/1990 | Hoshiko | 521/54 |
| 4,994,316 | 2/1991 | Browne et al. | 428/209 |
| 5,814,883 | 9/1998 | Sawai et al. | 257/700 |

FOREIGN PATENT DOCUMENTS

| | | |
|---|---|---|
| 33 05 105 | 8/1984 | Germany . |
| 56-49256 | 5/1981 | Japan . |
| 56-49257 | 5/1981 | Japan . |
| 2-140271 | 5/1990 | Japan . |
| 5-138794 | 6/1993 | Japan . |
| 8-046309 | 2/1996 | Japan . |
| WO 97/14280 | 4/1997 | WIPO . |

OTHER PUBLICATIONS

Japanese Standards Association; Test Methods of copper–clad laminates for printed wiring boards; JIS C 6481; pp. 1–48; Nov. 1996.

Patent Abstracts of Japan, vol. 199, No. 701, Jan. 31, 1997, JP 08 241625, Sep. 17, 1996.
Patent Abstracts of Japan, vol. 17, No. 640 (E–1465), Nov. 26, 1993, JP 05 206325, Aug. 13, 1993.
Patent Abstracts of Japan, vol. 199, No. 901, Jan. 29, 1999, JP 10 289969, Oct. 27, 1998.
Patent Abstracts of Japan, vol. 15, No. 56, (C–0804), Feb. 8, 1991, JP 02 283766, Nov. 21, 1990.
Patent Abstracts of Japan, vol. 199, No. 611, Nov. 29, 1996, JP 08 180745, Jul. 12, 1996.
Patent Abstracts of Japan, vol. 17, No. 565 (M–1495), Oct. 13, 1993, JP 05 162241, Jun. 29, 1993.
Patent Abstracts of Japan, vol. 17, No. 565 (M–1495), Oct. 13, 1993, JP 05 162240, Jun. 29, 1993.
Patent Abstracts of Japan, vol. 14, No. 382 (C–0749), Aug. 17, 1990, JP 02 140272, May. 29, 1990.
Patent Abstract of Japan, vol. 11, No. 353 (C–457), Nov. 18, 1987, JP 62 127336, Jun. 9, 1987.

*Primary Examiner*—Cathy F. Lam
*Attorney, Agent, or Firm*—Oblon, Spivak, McClelland, Maier & Neustadt, P.C.

[57] ABSTRACT

A low dielectric constant composition with a dielectric constant of 4 or less is disclosed. The composition comprises a matrix resin and crosslinked resin particles having an average particle diameter in the range from 0.03 to 10 μm, the crosslinked resin particles being prepared by the polymerization of 1–100 wt % of cross-linking monomers and 0–99 wt % of non-cross-linking monomers, having a dielectric constant of 3 or less, and having a 50 ppm or less average concentration of metal ions. The composition exhibits superior insulation properties and capable of producing an insulating material and sealing material with a low dielectric constant and low dielectric loss tangent (tan δ). An insulating material and a sealing material comprising this low dielectric composition and a circuit board provided with the insulating material or sealing material are also disclosed.

20 Claims, No Drawings

LOW DIELECTRIC COMPOSITION, INSULATING MATERIAL, SEALING MATERIAL, AND CIRCUIT BOARD

BACKGROUND OF THE INVENTION

1. Field of the Invention

The present invention relates to a low dielectric composition, an insulating material, a sealing material, and a circuit board. More particularly, the present invention relates to a low dielectric composition exhibiting superior insulation properties and capable of producing an insulating material and sealing material with a low dielectric constant and low dielectric loss tangent (tan δ), to an insulating material and a sealing material comprising the low dielectric composition, and to a circuit board provided with the insulating material or sealing material, in particular a circuit board exhibiting high reliability in the high frequency region.

2. Description of the Background Art

Laminated boards prepared from several sheets of prepregs by pressure-molding with heating is used as a substrate for electronic circuit boards. Such a prepreg is prepared by impregnating a glass fiber fabric substrate with a thermosetting resin such as epoxy resin or polyimide and drying the composite. Because such a laminated board has a high dielectric constant from 4.9 to 5.1, the resulting circuit board has a large electrostatic capacity, which causes generation of crosstalks among the circuits formed on the substrate. Such a laminated board is thus not necessarily satisfactory as a high frequency circuit board.

A method of filling a thermosetting resin with hollow glass particles has been proposed as a method for preparing laminated sheets for the circuit board with a low dielectric constant (Japanese Patent Applications Laid-open No. 49256/1981, No. 49257/1981, No. 138794/1993, and No. 46309/1996). According to this method, the dielectric constant of the laminated board is decreased due to the low dielectric constant of the gases such as air and nitrogen which are contained in the hollow glass particles.

In the preparation of the laminated board using this method, it is difficult to cause the hollow glass particles to homogeneously disperse in thermosetting resin due to inferior affinity of the hollow glass particles with the resin, resulting in laminated boards which contain voids. The use of laminated boards with voids contained therein is unsuitable for use as a material for circuit boards, since the mechanical strength of the substrates is remarkably impaired by such voids.

Due to the recent tendency of increased integration of circuit boards, a multi-layered circuit board prepared by laminating several substrates, each having circuits formed on the surface, has been developed. The substrates composing such a multi-layered circuit board should have more excellent insulation properties and a lower dielectric constant than the substrate for producing the above-mentioned monolayered circuit board.

The multi-layered circuit boards are provided with an insulating layer between the substrates to insulate the circuits so as to avoid contact of a circuit formed on the surface of one substrate with another circuit on another substrate. In addition, a sealing material layer is provided in the space between the circuit board and the semiconductor device which is produced when the semiconductor device is mounted on a mono-layer or multi-layer circuit board. Such a sealing material layer should have the same superior insulation properties and low dielectric constant as required for the substrates.

In recent years, a resin-sealed type using an epoxy resin composition has become the mainstream of semiconductor devices using semiconductor elements such as transistors, integrated circuits, and LSIs from the viewpoint of cost and mass production. Due to the high integration requirement brought about by the technological reform in the semiconductor field which accelerated the requirement for a large element with minute wiring patterns, the tendency toward miniaturization and using thinner parts is also required for such a resin-sealed type of semi-conductor equipment. Greater reliability (such as decreased crosstalk and reduced heat generation) is required for the sealing material.

The present invention has been achieved in view of this situation and has an object of providing a low dielectric composition exhibiting superior insulation properties and capable of producing an insulating material and sealing material with a low dielectric constant and low dielectric loss tangent (tan δ), an insulating material and a sealing material comprising the low dielectric composition, and a circuit board provided with the insulating material or sealing material, particularly a circuit board exhibiting high reliability in the high frequency region.

SUMMARY OF THE INVENTION

The inventors of the present invention have conducted extensive studies to achieve the above-mentioned objectives, and found that the addition of specific crosslinking resin particles to a specific matrix can produce a composition having a low dielectric constant which can form an insulating material and sealing material exhibiting a low dielectric constant and low dielectric loss tangent (tan δ). Specifically, the present invention is to provide the following composition with a low dielectric constant, insulating material, sealing material, and circuit board.

(1) A low dielectric constant composition with a dielectric constant of 4 or less comprising a matrix resin and crosslinked resin particles having an average particle diameter in the range from 0.03 to 10 μm, the crosslinked resin particles being prepared by the polymerization of 1–100 wt % of cross-linking monomers and 0–99 wt % of non-crosslinking monomers, having a dielectric constant of 3 or less, and having a 50 ppm or less average concentration of metal ions.

(2) The low dielectric constant composition defined in (1) above, wherein said crosslinked resin particles are hollow particles.

(3) The low dielectric constant composition defined in (1) above, wherein said matrix is a thermosetting resin or a thermoplastic resin.

(4) The low dielectric constant composition defined in (2) above, wherein said matrix is a thermosetting resin or a thermoplastic resin.

(5) An insulating material comprising the low dielectric constant composition defined in (1) above.

(6) An insulating material comprising the low dielectric constant composition defined in (2) above.

(7) The insulating material of (5) above having a dielectric loss tangent of 0.05 or less.

(8) The insulating material of (6) above having a dielectric loss tangent of 0.05 or less.

(9) A sealing material comprising the insulating material of (5) above.

(10) A sealing material comprising the insulating material of (6) above.

(11) A circuit board provided with at least one prepreg made from the insulating material defined in (5) above.

(12) A circuit board provided with at least one prepreg made from the insulating material defined in (6) above.

(13) The circuit board of (11) having a dielectric loss tangent of 0.05 or less.

(14) The circuit board of (12) having a dielectric loss tangent of 0.05 or less.

(15) The circuit board of (11) which is provided with a conductive part to form a circuit on one or both sides.

(16) The circuit board of (12) which is provided with a conductive part to form a circuit on one or both sides.

(17) A circuit board having two or more sheets of substrate and an insulation layer made from the insulating material (5) in the spaces between the substrates.

(18) A circuit board having two or more sheets of substrate and an insulation layer made from the insulating material (6) in the spaces between the substrates.

(19) A circuit board with a semiconductor device mounted on a substrate, wherein a sealing material layer of the sealing material (9) above is provided between the circuit board and the semiconductor device. (20) A circuit board with a semiconductor device mounted on a substrate, wherein a sealing material layer of the sealing material (10) above is provided between the circuit board and the semiconductor device.

Other objects, features and advantages of the invention will hereinafter become more readily apparent from the following description.

DETAILED DESCRIPTION OF THE INVENTION AND PREFERRED EMBODIMENTS

The low dielectric constant composition of the present invention has a dielectric constant of 4 or less and comprises a matrix resin and crosslinked resin particles which have an average particle diameter in the range from 0.03 to 10 $\mu$m, wherein the crosslinked resin is prepared by the polymerization of 1–100 wt % of cross-linking monomers and 0–99 wt % of non-cross-linking monomers and has a dielectric constant of 3 or less.

The "crosslinked resin" from which the crosslinked resin particles of the present invention are prepared is a resin having a glass transition temperature (TG) measured by the DSC of preferably 10° C. or higher, and more preferably 50° C. or higher.

The composition of cross-linking monomers and non-cross-linking monomers used for the polymerization to prepare the crosslinked resin particles in the present invention comprises 1–100 wt %, preferably 2–80 wt %, and more preferably 5–60 wt %, of the cross-linking monomers and 0–99 wt %, preferably 20–98 wt %, and more preferably 40–95 wt %, of the non-cross-linking monomers, provided that the total of the cross-linking monomers and non-cross-linking monomers is 100 wt %.

The crosslinked resin particles used in the present invention have the following characteristics. Specifically, the crosslinked resin particles have (i) an average particle diameter in the range from 0.03 to 10 $\mu$m, preferably from 0.1 to 2 $\mu$m, and more preferably from 0.2 to 1 $\mu$m; (ii) a dielectric constant of 3.0 or less, and preferably 2.5 or less; (iii) a metal ion concentration of 50 ppm or less, preferably 40 ppm or less, and more preferably 20 ppm or less; (iv) a dielectric loss tangent (tan $\delta$) of 0.1 or less, preferably 0.05 or less, and more preferably 0.01 or less; and (v) a 10 wt % weight loss temperatures measured by TGA (thermogravimetric analysis) of 200° C. or higher, preferably from 220 to 400° C., and more preferably from 250 to 380° C.

The above characteristic (i) causes the crosslinked resin particles to disperse with ease in the later-described low dielectric constant composition in the form of fine powders. The characteristic (ii) ensures that the insulating material formed from the low dielectric constant composition which contains these crosslinked resin particles has a low dielectric constant. The possession of the characteristic (iii) ensures that the crosslinked resin particles exhibit the characteristics (ii) and (iv) more satisfactorily. The characteristic (iv) ensures that the composition produces an insulating material with a low dielectric loss tangent, thus enabling fabrication of a circuit board which is less exothermic when used in the high-frequency region. The characteristic (v) indicates superior heat resistance of the crosslinked resin particles of the present invention, whereby the crosslinked resin particles are not substantially affected by heat when the low dielectric constant composition of the present invention is processed by soldering or the like. The metal ions in above-mentioned characteristic (iii) are metal ions which affect the insulation, dielectric constant, dielectric loss tangent, and the like of the insulating material. As examples of such metal ions, Na, K, Li, Fe, Ca, Cu, Al, Mn, and Sn ions can be given.

To prepare the crosslinked resin particles with the metal ion concentration in the range described in (iii) above, the following methods ① to ④ can be employed either individually or in combination.

① Using emulsifying agents and polymerization initiators which are free of such metals in the preparation of the crosslinked resin particles.

② Using water which contains only a minimal amount of such metal ions, such as ion exchange water, as the polymerization solvent in the polymerization reaction.

③ Purification of the resin particles obtained after polymerization by ultrafiltration or centrifuge.

④ A Solidification of the resin particles obtained after polymerization with an acid or salt, and washing with water which contains only a minimal amount of metal ions, such as ion exchange water.

The chlorine ion concentration in the crosslinked resin particles is preferably 50 ppm or less, preferably 40 ppm or less, and most preferably 20 ppm or less, to ensure anti-corrosion properties of the products.

As the emulsifying agent used for the polymerization of the crosslinked resin particles of the present invention, an ammonium salt-type anion emulsifying agent, nonionic emulsifying agent, or organic acid salt-type cationic emulsifying agent can be given. As the initiator, an organic peroxide, an azo compound, or an ammonium salt-type persulfate can be suitably used.

It is desirable that the crosslinked resin particles used in the present invention be hollow particles (such hollow particles are hereinafter referred to as "hollow crosslinked resin particles" from time to time). Because the hollow crosslinked resin particles contain gases with a low dielectric constant such as air and nitrogen, such particles themselves have a low dielectric constant. In addition, because the hollow crosslinked resin particles exhibit excellent affinity with polymers and the like, production of voids in the insulating material formed from the low dielectric constant composition which contains the hollow crosslinked resin particles can be prevented. This can prevent the mechanical strength of the insulating material from being impaired.

In addition to the above-described characteristics (i) to (v), it is desirable for the hollow crosslinked resin particles used in the present invention to satisfy the following characteristics from the viewpoint of ensuring a low dielectric constant. Specifically, it is desirable that the hollow crosslinked resin particles have (vi) an internal diameter of 0.1–0.9 times, preferably 0.2–0.9 times, and more preferably 0.3–0.9 times the outer diameter, and (vii) an average specific gravity of 0.5–1.2, preferably 0.6–1.1, and more preferably 0.65–1.0.

In the present invention the dielectric constant and the dielectric loss tangent (tan δ) are measured according to JIS C6481 at a frequency $10^6$ Hz.

Although there are no specific limitations to the method for preparing such hollow crosslinked resin particles used in the present invention, the following methods (I) to (VIII) can be given as typical examples (see Japanese Patent Publication No. 68324/1992, for example).

(I) A method of incorporating a foaming agent in polymer particles, causing the foaming agent to foam, then causing cross-linking monomers to be absorbed and to polymerize.

(II) A method of incorporating a volatile substance such as butane in polymer particles, gasifying the volatile substance to make the particles hollow, then causing cross-linking monomers to be absorbed and to polymerize.

(III) A method comprising melting a polymer, bubbling a jet of gas such as air into the molten polymer, and causing cross-linking monomers to be absorbed and to polymerize.

(IV) A method comprising impregnating polymer particles with an alkaline swelling substance, causing this substance to swell, and then causing cross-linking monomers to be absorbed and to polymerize.

(V) A method of preparing an oil-in-water emulsion of cross-linking monomers and polymerizing the monomers.

(VI) A two step polymerization method comprising providing seeds of polymer particles, causing a specific monomer composition comprising cross-linking monomers to be absorbed in the seeds, and causing the monomers to polymerize and cross-link.

(VII) A method of causing cross-linking monomers to polymerize and shrink.

(VIII) A method of spraying and drying cross-linking polymer particles.

Of the above-mentioned methods, the two step polymerization method of (VI) is desirable. The two step polymerization method (VI) is preferably carried out by providing 100 parts by weight of monomers which comprise (a) 1–50 wt % of cross-linking monomers (hereinafter may be called "polymerizable monomer (a)"), (b) 1–99 wt % of hydrophilic monomers which comprise 1–40 wt % of non-cross-linking unsaturated carboxylic acid and/or 5–99 wt % of other hydrophilic monomers (hereinafter may be called "polymerizable monomer (b)"), and (c) 0–85 wt % of other non-cross-linking copolymerizable monomers (hereinafter called "polymerizable monomer (c)"); dispersing these polymerizable monomer components (a), (b), and (c) in the presence of 1–100 parts by weight of the other polymer (hereinafter called "different polymer") which are different from the polymer to be prepared from the polymerizable monomer components (a), (b), and (c) of the above composition; and polymerizing the polymerizable monomer components (a), (b), and (c) using the different polymer as a seed (see Japanese Patent Application Laid-open No. 127336/1987).

In addition, it is possible to use the hollow crosslinked resin particles thus obtained as the seed polymer and to perform additional seed polymerization using at least one of the polymerizable monomers (a), (b), and (c). The hollow crosslinked resin particles which possess two or more polymer layers can be obtained in this manner. Such hollow crosslinked resin particles can also be used in the present invention (Japanese Patent Applications Laid-open No. 140271/1990and No. 140272/1990).

Examples of the above-mentioned polymerizable monomer (a) include, but are not limited to, divinyl-type or trivinyl-type monomers such as divinylbenzene, ethylene glycol dimethacrylate, 1,3-butylene glycol dimethacrylate, trimethylolpropane trimethacrylate, and allyl methacrylate. Of these, divinylbenzene, ethylene glycol dimethacrylate, and trimethylolpropane trimethacrylate are preferred.

Examples of the above-mentioned polymerizable monomer (b) include, but are not limited to, vinyl-type monomers such as vinylpyridine, glycidyl acrylate, glycidyl methacrylate, methyl acrylate, methyl methacrylate, acrylonitrile, acrylamide, N-methylolacrylamide, N-methylolmethacryl amide, acrylic acid, methacrylic acid, itaconic acid, fumaric acid, styrene sulfonic acid sodium, vinyl acetate, dimethylaminoethyl methacrylate, diethylaminoethyl methacrylate, 2-hydroxyethyl methacrylate, and 2-hydroxypropyl methacrylate. Of these, methacrylic acid, itaconic acid, and acrylic acid are preferred.

There are no specific limitations to the monomers used as the above-mentioned polymerizable monomer (c), inasmuch as such monomers are radical polymerizable monomers. Examples of such monomers which can be used include aromatic vinyl monomers such as styrene, α-methylstyrene, p-methylstyrene, and halogenated styrene; vinyl esters such as vinyl propionate; ethylenically unsaturated carboxylic acid alkyl esters such as ethyl methacrylate, butyl acrylate, butyl methacrylate, 2-ethylhexyl acrylate, 2-ethylhexyl methacrylate, lauryl acrylate, and lauryl methacrylate; maleimide compounds such as phenyl maleimide and cyclohexyl maleimide; and conjugation diolefins such as butadiene and isoprene. Of these monomers, styrene is desirable.

The above-mentioned "different polymer" is a polymer different from the polymer obtained by the polymerization of the above-mentioned monomer composition which consists of the polymerizable monomers (a), (b), and (c). The term "different" as used herein has a broad concept and includes the difference in the molecular weight and the composition. Specifically, the "different polymer" includes not only the polymers made from different monomers, but also the polymers made from the same monomers but having a different molecular weight or a different ratio of copolymerization.

Given as examples of such a different polymer are polystyrene, carboxyl-modified polystyrene, carboxyl-modified styrene-butadiene copolymer, styrene-butadiene copolymer, styrene-acrylic ester copolymer, styrene-methacryl ester copolymer, styrene-acrylic ester copolymer, methacryl ester copolymer, carboxyl-modified (styrene-acrylic ester) copolymer, carboxyl-modified (styrene-methacryl ester) copolymer, and the like. Of these, desirable different polymers are polystyrene and a styrene copolymer which includes 50 wt % or more styrene components.

The hollow crosslinked resin particles are preferably cross-linked to the extent that the resin maintains the form of particles when an insulation plate is formed using the hollow crosslinked resin particles by heating under pressure. By using the above-mentioned methods, particularly by using the method (VI) previously described in detail, the homogeneous particles of which 70 wt % or more have a diameter falling within the range from −20% to +20% of the average particles diameter can be obtained. Such particles can be suitably used as the raw material for the low dielectric constant composition of the present invention.

The low dielectric constant composition of the present invention comprises the crosslinked resin particles thus obtained which are incorporated in a matrix. The composition can be formed into articles with a desired shape by curing by heat, using a crosslinking agent, by irradiation with radioactive rays or lights (hereinafter may be collectively called "light"), or by a melt-extrusion molding method.

There are no specific limitations to the matrix used in the present invention. Thermosetting resins, thermoplastic resins, unvulcanized rubbers, photo-curable compounds, and the like can be given as examples.

The thermosetting resins used here include, but are not limited to, imide resin, phenol resin, cyanate resin, cyanic acid ester resin, epoxy resin, unsaturated polyester resin, polycarbodiimide resin, bismaleimide-triazine resin (BT resin), and the like can be given.

The thermoplastic resins which can be used here include, but are not limited to, polyolefin resins such as polyethylene resin, polypropylene resin, poly-l-butene resin, poly-4-methyl-l-pentene resins; polyester resins such as polyethylene terephthalate resin and polyethylene naphthalate resin; polyamide resins such as nylon 6 and nylon 66; fluoro resins such as polytetrafluoroethylene resin and polytrifluoroethylene resin; polystyrene resins, polyvinylchloride resins, polymethyl (meth)acrylate resins, polycarbonate resins, polyether sulfone resins, and the like.

The above-mentioned unvulcanized rubbers include, but are not limited to, polybutadiene rubber, natural rubber, polyisoprene rubber, isobutylene-isoprene rubber, polychloroprene rubber, butadiene-styrene-rubber, butadiene-acrylonitrile rubber, acrylic rubber, fluoro rubber, silicone rubber, and mixtures and composites of these rubbers.

As examples of the above-mentioned photo-curable compounds, (meth)acrylate-type monomers, aromatic vinyl-type monomers, and the like can be given, but the examples are not limited to these. Specific examples of preferable photo-curable compounds include ethylene glycol di(meth)acrylate, dipentaerythritol hexa(meth)acrylate, trimethylolpropane tri(meth)acrylate, divinylbenzene, and the like.

Of these, preferred matrixes are thermosetting resins, with particularly preferred resins being epoxy resins and imide resins.

As specific examples of the epoxy resins, biphenyl epoxy resins, cresol novolak epoxy resins, phenol novolak epoxy resins, bisphenol A epoxy resins, and combinations of these epoxy resins can be given.

It is possible to add the above-mentioned unvulcanized rubber to the thermosetting resin or thermoplastic resin. The addition of the unvulcanized rubber can improve flexibility of the insulating material formed from the low dielectric constant composition comprising a thermosetting resin or a thermoplastic resin as the matrix resin.

The amount of crosslinked resin particles incorporated in the matrix to prepare the low dielectric constant composition of the present invention is determined taking into account factors such as adequate insulation characteristics and a sufficiently low dielectric constant for the resulting insulating material, the minimal abrasion of jigs such as drills used in fabricating the circuit board having a substrate made of the insulating material, and the like. Specifically, such an amount of the crosslinked resin particles is in the range of 1 to 200 parts by weight, preferably of 5 to 150 parts by weight, and more preferably of 10 to 100 parts by weight, for 100 parts by weight of the matrix resin.

Components other than the matrix and crosslinked resin particles can be added to the low dielectric constant composition of the present invention as required.

When the matrix is a thermosetting resin, a curing agent or curing adjuvant which conforms to the thermosetting resin can be incorporated in the matrix. Such a curing agent or curing adjuvant can be suitably selected by a person skilled in the art.

When the matrix is an unvulcanized rubber, a vulcanizing agent, vulcanizing adjuvant, crosslinking agent, or crosslinking adjuvant which conforms to the rubber can be incorporated in the matrix. Such a vulcanizing agent, vulcanizing adjuvant, crosslinking agent, or cross-linking adjuvant can be suitably selected by a person skilled in the art.

When the matrix is a photo-curable compound, a photo-polymerization initiator, a photosensitizer, and the like can be added to the matrix.

Beside these additives, antioxidants, flame retarding agents, flame retarding adjuvants, surface lubricants, coupling agents, pigments, dyes, and the like can be added to the low dielectric constant composition to the extent that the objective of the present invention is not impaired.

The preparation of the low dielectric constant composition can be suitably performed according to the type of the matrix used.

When the matrix is a thermosetting resin, the composition is preferably prepared as a varnish using a solvent which is inert to but dissolves the thermosetting resin. Although the type of the solvent is suitably selected according to the type of thermosetting resin, the same solvent as that used for the preparation of a conventionally known varnish of thermosetting resin can be used. Even though the crosslinked resin particles may be either an aqueous dispersion or a dry powder, it is desirable to incorporate hollow crosslinked resin particles in the form of dry powder in a varnish of the thermosetting resin.

When the thermosetting resin is a solid, the low dielectric constant composition in the form of a sheet can be prepared by evaporating the solvent from the above-mentioned varnish or by kneading the composition using a roll at a temperature at which the cure reaction does not substantially take place, followed by press-rolling using a roller mill.

When the matrix is a thermoplastic resin or unvulcanized rubber, the composition can be prepared by melting and kneading the matrix, crosslinked resin particles, and any optionally added additives according to a conventional method. Equipment such as a kneader, uniaxial extruder, biaxial extruder, or Banbury mixer can be used for melting and kneading the composition.

When the matrix is a photo-curable compound, the composition is prepared in the form of a varnish in which each component is dissolved using an inert solvent.

The low dielectric constant composition of the present invention can be prepared as a composite including a substrate.

Given as examples of the substrate are glass fibers, fabrics of glass fibers, polyamide fibers, woven or nonwoven fabrics of polyamide fibers, polyester fibers, woven or nonwoven fabrics of polyester fibers, Teflon fibers, woven or nonwoven fabrics of Teflon fibers, and woven or nonwoven mixed fabrics of these materials. The above woven or nonwoven fabrics are preferably in the form of a sheet. An appropriate material for the substrate is selected according to the type of application of the insulating material. When the insulating material is used for a circuit board such as a printed-wiring board, glass fiber fabric is desirable.

When the matrix is a thermosetting resin, the varnish may be impregnated into the substrate, into preferably fabrics, thereby obtaining a prepreg in which the low dielectric constant composition is impregnated in the substrate.

Moreover, when the matrix is a thermoplastic resin or unvulcanized rubber, the above-mentioned substrate, preferably fibers which are not in the sheet form, may be added when crosslinked resin particles and other components are kneaded, whereby the low dielectric constant composition including a substrate can be prepared.

The low dielectric constant composition of the present invention thus prepared is appropriately formed and processed according to the application to obtain an insulating material.

When the matrix contained in the composition is a thermosetting resin, the composition is heated according to the type of thermosetting resin and cured into a desired shape to obtain an insulating material.

When the matrix contained in the composition is a thermoplastic resin, the composition is formed into an insulating material with a desired shape by extrusion molding, injection molding, or the like. Moreover, it is possible to form sheets or films obtained by the extrusion molding into an object with a desired shape by vacuum molding, air-pressure forming, or the like. When the thermoplastic resin is crosslinkable with radioactive rays, the formed sheets or films may be exposed to radioactive rays to increase rigidity.

When the matrix contained in the composition is an unvulcanized rubber, an insulating material can be obtained using a vulcanizing agent or crosslinking agent while heating.

When the resin is a photo-curable resin, an insulating material can be formed by irradiating the resin.

The insulating material of the present invention has a dielectric constant of 4 or less, preferably 3.9 or less, and more preferably 3.7 or less. In addition, the insulating material has a dielectric loss tangent of 0.05 or less, preferably 0.01 or less, and more preferably 0.005 or less.

Because the insulating material of the present invention which is formed from the above-mentioned low dielectric constant composition not only exhibits superior insulation characteristics, but also has a low dielectric constant and low dielectric loss tangent, the composition can be advantageously used for a substrate for forming a circuit board for mounting semiconductor devices such as LSI, an insulation layer between the substrates for insulating the circuits formed on multi-layer circuit boards, a sealing material layer to be formed in the space between the semiconductor device and circuit board when the semiconductor device is mounted (for example, by flip mounting) on the circuit board, and a sealing material layer to fabricate semiconductor equipment by sealing a semiconductor device. The composition is particularly suitable for use as a material of the insulating layer between the substrates of the above-mentioned multi-layer circuit board and as a material for the sealing layer between the semiconductor device and circuit board when the semiconductor device is mounted on the circuit board.

The circuit board of the present invention is provided with the above-mentioned insulating material or sealing material, and has a dielectric loss tangent of 0.05 or less, preferably 0.01 or less, and more preferably 0.005 or less.

In addition, the insulation layer of the circuit board of the present invention has a thickness of 20 to 100 $\mu$m, preferably of 40 to 90 $\mu$m, and more preferably of 50 to 70 $\mu$m, the same as conventional circuit boards.

It is preferable that the thickness of the above-mentioned sealing material layer in the circuit board of the present invention be equivalent to the thickness of the above-mentioned space.

There are no specific limitations to the method for forming the insulation layer and sealing material layer of the present invention. The method described in Japanese Patent Application Laid-open No.289969/1998, for example, can be applied.

It is preferable that the circuit board of the present invention possess at least one sheet of substrate made of the above-mentioned insulating material and the substrate be provided with a conductive part on one or both sides, for example, a metal foil (preferably a copper foil or a gold-plated copper foil) on which a circuit is formed. Furthermore, when the circuit board of the present invention is a multi-layer circuit board and/or a circuit board on which a semiconductor device is mounted, this circuit board is provided with at least one insulating layer and/or sealing layer made of said insulating material between and/or on the substrates. Here, when two or more insulation layers and/or sealing material layers are provided between substrates, it is desirable that all of these insulation layers and/or sealing material layers be made of the above-mentioned insulating material.

When the circuit board of the present invention is a multi-layer rigid printed-wiring board, for example, it is desirable that a thermosetting resin be used as a matrix for the substrate, with an epoxy resin being particularly preferred. Moreover, it is desirable that the substrate be made from a composite insulating material, preferably including glass fabrics. Many of these rigid printed-wiring boards have four or more layers, and occasionally ten layers, of substrate, and are applied to computers and communication equipment such as mobile phones. The thickness of each substrate of a multi-layer rigid printed-wiring board is usually from 20 to 100 $\mu$m, preferably from 40 to 90 $\mu$m, and more preferably from 50 to 70 $\mu$m. The total thickness of the multi-layer printed board is usually from 1 to 10 mm, preferably from 1.5 to 8 mm, and more preferably from 2 to 6 mm.

A board using a phenol resin as a matrix and paper as a substrate can be used as a mono-layer one side or both sides of a rigid printed-wiring board.

In addition, when the circuit board of the present invention is a flexible printed wiring board, an imide resin or polyester resin can be preferably used as a matrix for the substrate (film). The thickness of such a film is usually from 25 to 50$\mu$m.

There are no specific limitations to the method for fabricating such a rigid printed-wiring board and flexible printed wiring board.

The present invention will be explained in more detail by way of examples, which are not intended to be limiting of the present invention.

EXAMPLES

In the examples hereinafter unless otherwise designated, "parts" and "%" respectively indicate "parts by weight" and "% by weight".

Various properties in the examples and comparative examples were measured and evaluated according to the following methods.

(1) Metal ion concentration:

The amount of metal ions (sodium ion and potassium ion) was measured by atomic absorption spectrometry. The amount of metal ions other than sodium ions and potassium ions was below the detection limit.

(2) The average particle diameter:

The particle diameter of 100 particles was measured by electron microscope and the average was calculated.

(3) Heat weight loss temperature:

The 10 wt % weight loss temperature was measured by TGA in a nitrogen atmosphere at a temperature rise of 10° C./minute.

(4) Glass transition temperature:

The glass transition temperature was measured by DSC.

(5) Dielectric constant and dielectric loss tangent:

The dielectric constant and dielectric loss tangent were measured at a frequency of $10^6$ Hz according to JIS C 6481.

(6) Solder heat resistance:

The solder heat resistance was determined by measuring the time required for the sample to swell, while the sample was allowed to float on a solder bath at 260° C.

(7) Insulation resistance:

The insulation resistance was measured according to JIS C 6481 after the sample was treated for 6 hours in a pressure cooker at 121° C.

<Preparation of crosslinked resin particles>

Preparation Example 1

A mixture of 70 parts of styrene, 27 parts of butadiene, 3 parts of itaconic acid, 12 parts of t-dodecylmercaptan, and an aqueous solution of 0.5 part of a reactive emulsifying agent SE10N (manufactured by Adeka Co., Ltd.) and 1.0 part of ammonium persulfate in 200 parts of distilled water was stirred for 8 hours at 75° C. to obtain polymer particles. The polymer particles had an average particle diameter of 0.24 μm, 6% of a toluene insoluble portion, and a number average molecular weight (measured by GPC) of 5,000, and a ratio of the weight average molecular weight and the number average molecular weight (Mw/Mn) of 2.6.

A polymerization reaction was carried out using these polymer particles as a seed polymer. Specifically, 10 parts of the polymer particles, 0.1 part of polyoxyethylene nonyl phenyl ether, 0.4 part of lauryl ammonium sulfate, and 0.5 part of ammonium persulfate were dispersed in 900 parts of distilled water. A mixture of 50 parts of methyl methacrylate, 40 parts of divinylbenzene, 10 parts of α-methylstyrene, and 20 parts of toluene were added to the dispersion. The mixture was polymerized for 5 hours at 75° C. to obtain a dispersion of capsule particles which contains toluene therein at a polymerization yield of 98%.

The dispersion liquid was steam stripped and the resulting crosslinked resin particles were observed by transmission electron microscope to confirm that the central part of the particles was transparent and the crosslinked resin particles were thus complete globular hollow fine particles. The average external diameter of the particles was 0.44 μm, the average internal diameter was 0.3 μm, and the specific gravity was 0.72. In addition, the crosslinked resin particles had an average metal ion concentration of 5 ppm, a 10 wt % heat weight loss temperature of 320° C., and a glass transition temperature of 200° C. or higher. The resin particles were spray dried to obtain crosslinked resin particles powder A. The crosslinked resin particle powder A (100 parts) was incorporated and encapsulated in the resin varnish (303.2 parts) prepared in Example 1 later described to measure the dielectric constant. The dielectric constant of the crosslinked resin particles A calculated by the Maxwell Model was 1.9.

Preparation Example 2

A mixture of 97 parts of styrene, 3 parts of acrylic acid, and 12 parts of t-dodecylmercaptan, and an aqueous solution of 1.0 part of a reactive emulsifying agent SE10N (manufactured by Adeka Co., Ltd.) and 1.0 part of ammonium persulfate in 200 parts of distilled water was stirred for 8 hours at 75° C. to obtain polymer particles. The polymer particles had an average particle diameter of 0.18 μm, 6% of a toluene insoluble portion, and a number average molecular weight (measured by GPC) of 6,000, and a ratio of the weight average molecular weight and the number average molecular weight (Mw/Mn) of 4.0.

A polymerization reaction was carried out using these polymer particles as a seed polymer. Specifically, 10 parts of the polymer particles, 0.3 part of polyoxyethylene nonyl phenyl ether, 0.2 part of lauryl ammonium sulfate, and 1 part of α,α'-azobisisobutyronitrile were dispersed in 900 parts of distilled water. A mixture of 80 parts of styrene and 20 parts of divinylbenzene was added to the dispersion. The mixture was polymerized for 5 hours at 75° C. to obtain a dispersion of crosslinked resin particles at a polymerization yield of 98%.

The dispersion liquid was steam stripped and the resulting crosslinked resin particles were observed by a transmission electron microscope to confirm that the crosslinked resin particles were thus complete globular fine particles. The average diameter of the particles was 0.40 μm. In addition, the crosslinked resin particles had an average metal ion concentration of 3 ppm, a 10 wt % heat weight loss temperature of 350° C., and a glass transition temperature of 200° C. or higher. The resin particles were spray dried to obtain a crosslinked resin particles powder B. The crosslinked resin particle powder B (100 parts) was incorporated and encapsulated in the resin varnish (303.2 parts) prepared in Example 1 later described to measure the dielectric constant. The dielectric constant of the crosslinked resin particles B calculated by the Maxwell Model was 2.1.

Preparation Example 3

A mixture of 96 parts of styrene, 4 parts of methacrylic acid, and 5 parts of t-dodecylmercaptan, and an aqueous solution of 0.3 part of a reactive emulsifying agent SE10N (manufactured by Adeka Co., Ltd.) and 1.0 part of ammonium persulfate in 200 parts of distilled water was stirred for 8 hours at 75° C. to obtain polymer particles. The polymer particles had an average particle diameter of 0.3 μm, 6% of a toluene insoluble portion, and a number average molecular weight (measured by GPC) of 8,000, and a ratio of the weight average molecular weight and the number average molecular weight (Mw/Mn) of 3.2.

A polymerization reaction was carried out using these polymer particles as a seed polymer. Specifically, 10 parts of the polymer particles, 0.3 part of polyoxyethylene nonyl phenyl ether, 0.2 part of lauryl ammonium sulfate, and 1 part of α,α'-azobisisobutyronitrile were dispersed in 900 parts of distilled water. A mixture of 90 parts of styrene and 10 parts of trimethylolpropane trimethacrylate was added to the dispersion. The mixture was polymerized for 5 hours at 75° C. to obtain a dispersion of crosslinked resin particles at a polymerization yield of 98%.

The dispersion liquid was steam stripped and the resulting crosslinked resin particles were observed by transmission electron microscope to confirm that the crosslinked resin particles were thus complete globular fine particles. The average diameter of the particles was 0.67 μm. In addition, the crosslinked resin particles had an average metal ion concentration of 2 ppm, a 10 wt % heat weight loss temperature of 330° C., and a glass transition temperature of 200° C. or higher. The resin particles were spray dried to obtain a crosslinked resin particles powder C. The crosslinked resin particle powder C (100 parts) was incorporated and encapsulated in the resin varnish (303.2 parts) prepared in Example 1 later described to measure the dielectric constant. The dielectric constant of the crosslinked resin particles C calculated by the Maxwell Model was 2.0.

Preparation Example 4

Non-crosslinked resin particles were prepared in the same manner as in Preparation Example 1, except that 0.4 part of sodium lauryl sulfate instead of lauryl ammonium sulfate as the emulsifying agent, 0.5 part of sodium persulfate instead of ammonium persulfate, 100 parts of methyl methacrylate instead of 50 parts of methyl methacrylate, 40 parts of divinylbenzene, and 10 parts and α-methyl styrene were used. The non-crosslinked resin particles thus obtained had an average particle diameter of 0.50 μm, an average metal ion concentration of 500 ppm, a 10 wt % heat weight loss temperature of 180° C., and a glass transition temperature of 103° C. The resin particles were spray dried to obtain a non-crosslinked resin particle powder D. The non-crosslinked resin particle powder D (100 parts) was incorporated and encapsulated in the resin varnish (303.2 parts) prepared in Example 1 later described to measure the dielectric constant. The dielectric constant of the non-crosslinked resin particles C calculated by the Maxwell Model was 4.3.

The composition and properties of the crosslinked resin particles A–C and the non-cross-linking resin particles D are shown in Table 1.

TABLE 1

| | Preparation Example | | | |
|---|---|---|---|---|
| | 1 | 2 | 3 | 4 |
| Crosslinked resin particles | A | B | C | |
| Non-crosslinked resin particles | | | | D |
| Seed polymer | | | | |
| Composition | ST/BD/TA = 70/27/3 | ST/AA = 97/3 | ST/MA = 96/4 | ST/BD/TA = 70/27/3 |
| Part | 10 | 10 | 10 | 10 |
| Crosslinking monomer | | | | |
| DVD | 40 | 20 | — | — |
| TMPMA | — | — | 10 | — |
| Non-crosslinking monomer | | | | |
| MMA | 50 | — | — | 100 |
| ST | — | 80 | 90 | — |
| AMS | 10 | — | — | — |
| Average particle size (μm) | 0.44 | 0.40 | 0.67 | 0.50 |
| Average metal ion concentration (ppm) | 5 | 3 | 2 | 500 |
| 10 wt % weight loss temperature (°C.) | 320 | 350 | 330 | 180 |
| Glass transition temperature (°C.) | ≧200 | ≧200 | ≧200 | 103 |

ST: Styrene
BD: Butadiene
TA: Itaconic acid
AA: Acrylic acid
MA: Methacrylic acid
DVB: Divinylbenzene
TMPMA: Trimethylolpropane trimethacrylate
MMA: Methyl methacrylate
AMS: α-methylstyrene <Preparation of insulating plate (circuit board)>

Examples 1–3

A resin varnish was prepared by adding 3 parts by weight of dicyandiamide, 0.2 part by weight of 2-ethyl-4-methylimidazole as a catalyst, and 200 parts by weight of ethyl carbitol as a solvent to 100 parts by weight of epoxy resin (Ep-1001, manufactured by Yuka Shell Epoxy Co., epoxy equivalent:480).

The 100 parts by weight of the crosslinked resin particle powder A–C prepared in Preparation Examples 1–3 was incorporated in the resin varnish. The mixture was impregnated into glass fiber fabric (garammage: 215 g) and dried to prepare one layer prepreg (a) which contains 50 wt % of the resin.

Copper foil (thickness 18 μm) was layered over both side of the prepreg (a) and press-molded at a pressure of 40 Kg/cm$^2$ for 60 minutes while heating at 170° C. to obtain a copper clad insulating board with a thickness of 0.2 mm. The characteristics of the copper clad insulating board (circuit board) are shown in Table 2.

Example 4

Eight sheets of the prepreg (a) prepared in Example 1 were layered and both external sides were clad by a copper foil (thickness 18 μm). The product was pressure-molded with heating under the same conditions as in Example 1 to obtain an insulating board with a thickness of 1.6 mm. The characteristics of the insulating board are shown in Table 2.

Comparative Examples 1 and 2

Copper clad insulating boards were prepared in the same manner as in Example 1, except for using a hollow globular glass powder (an average particle diameter: 10 μm, Comparative Example 2) or the non-cross-linked resin particle powder D (Comparative Example 1) was used instead of the crosslinked resin particle powder A. The characteristics of the copper clad insulating boards are shown in Table 2.

Comparative Example 3

An insulation board was prepared in the same manner as in Example 4, except for using the non-cross-linking resin particle powder D instead of the crosslinked resin particle powder A of the Example 4. The characteristics of the insulating board are shown in Table 2.

TABLE 2

| | Example | | | | Comparative Example | | |
|---|---|---|---|---|---|---|---|
| | 1 | 2 | 3 | 4 | 1 | 2 | 3 |
| Crosslinking resin particle | A | B | C | A | | | |
| Non-crosslinking resin particle | | | | | D | | D |
| Non-resin particle | | | | | | Glass | |
| Insulating board | Mono-layer | Mono-layer | Mono-layer | Multi-layer | Mono-layer | Mono-layer | Multi-layer |
| Dielectric constant | 3.3 | 3.4 | 3.3 | 3.3 | 4.1 | 4.3 | 4.1 |
| Dielectric loss tangent | 0.007 | 0.005 | 0.006 | 0.006 | 0.05 | 0.01 | 0.05 |
| Solder heat resistance (sec) | 100 | 120 | 100 | 120 | 30 | 120 | 40 |
| Insulation resistance ($\Omega \cdot cm$) | $10^{13}$ | $10^{13}$ | $10^{13}$ | $10^{13}$ | $10^{11}$ | $10^{10}$ | $10^{11}$ |

As can be seen from Table 2, the insulating boards (circuit boards) of Examples 1–4 exhibit superior solder heat resistance and excellent electrical characteristics such as high insulation resistance, low dielectric constant and dielectric loss tangent.

On the other hand, the copper clad insulating boards of Comparative Examples 1 and 3 using the non-crosslinking resin particle powder D which contains a large amount of metal ions not only exhibit inferior electrical characteristics, i.e. small insulation resistance and large dielectric constant and dielectric loss tangent, but also exhibit inferior solder heat resistance. The copper clad insulating boards of Comparative Examples 2, in which hollow globular glass powder is used, exhibits high solder heat resistance, but inferior electrical characteristics. That is, its insulation resistance is small and dielectric constant and dielectric loss tangent are large.

It can thus be understood that the insulating board (circuit board) of the present invention well satisfies the characteristics required for the insulation boards (circuit boards) which are used in the high-frequency wave range.

Obviously, numerous modifications and variations of the present invention are possible in light of the above teachings. It is therefore to be understood that, within the scope of the appended claims, the invention may be practiced otherwise than as specifically described herein.

What is claimed id:

1. A low dielectric constant composition with a dielectric constant of 4 or less comprising a matrix resin and crosslinked resin particles having an average particle diameter in the range from 0.03 to 10 μm, the crosslinked resin particles being prepared by the polymerization of 1–100 wt % of cross-linking monomers and 0–99 wt % of non-cross-linking monomers, having a dielectric constant of 3 or less, and having a 50 ppm or less average concentration of metal ions.

2. The low dielectric constant composition according to claim 1, wherein said crosslinked resin particles are hollow particles.

3. The low dielectric constant composition according to claim 1, wherein said matrix is a thermosetting resin or a thermoplastic resin.

4. The low dielectric constant composition according to claim 2, wherein said matrix is a thermosetting resin or a thermoplastic resin.

5. An insulating material comprising the low dielectric constant composition according to claim 1.

6. An insulating material comprising the low dielectric constant composition according to claim 2.

7. The insulating material according to claim 5 having a dielectric loss tangent of 0.05 or less.

8. The insulating material according to claim 6 having a dielectric loss tangent of 0.05 or less.

9. A sealing material comprising the insulating material according to claim 5.

10. A sealing material comprising the insulating material according to claim 6.

11. A circuit board provided with at least one prepreg made from the insulating material according to claim 5.

12. A circuit board provided with at least one prepreg made from the insulating material according to claim 6.

13. The circuit board according to claim 11 having a dielectric loss tangent of 0.05 or less.

14. The circuit board according to claim 12 having a dielectric loss tangent of 0.05 or less.

15. The circuit board according to claim 11 which is provided with a conductive part to form a circuit on one or both sides.

16. The circuit board according to claim 12 which is provided with a conductive part to form a circuit on one or both sides.

17. A circuit board having two or more sheets of substrate and an insulation layer made from the insulating material according to claim 5 wherein said insulation layer is located between said two or more sheets of substrates.

18. A circuit board having two or more sheets of substrate and an insulation layer made from the insulating material according to claim 6 wherein said insulation layer is located between said two or more sheets of substrates.

19. A circuit board with a semiconductor device mounted on a substrate, wherein a sealing material layer of the sealing material according to claim 9 is provided between the circuit board and the semiconductor device.

20. A circuit board with a semiconductor device mounted on a substrate, wherein a sealing material layer of the sealing material according to claim 10 is provided between the circuit board and the semiconductor device.

* * * * *